(12) United States Patent  
Rosen

(10) Patent No.: US 7,358,755 B1  
(45) Date of Patent: Apr. 15, 2008

(54) RING OSCILLATOR SYSTEM

(75) Inventor: Eitan Rosen, Abirim (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 46 days.

(21) Appl. No.: 11/121,824

(22) Filed: May 3, 2005

Related U.S. Application Data

(62) Division of application No. 10/444,901, filed on May 23, 2003, now Pat. No. 6,933,739.

(51) Int. Cl.
*G01R 31/02* (2006.01)

(52) U.S. Cl. .................... 324/763; 324/765

(58) Field of Classification Search ............... 324/763, 324/765
See application file for complete search history.

(56) References Cited

U.S. PATENT DOCUMENTS

| | | | | |
|---|---|---|---|---|
| 5,473,259 A | * | 12/1995 | Takeda | 324/760 |
| 5,619,463 A | * | 4/1997 | Malhi | 365/201 |
| 5,994,915 A | * | 11/1999 | Farnworth et al. | 324/765 |
| 5,995,428 A | * | 11/1999 | Chien et al. | 365/201 |
| 6,005,408 A | | 12/1999 | Gillette | |
| 6,091,255 A | | 7/2000 | Godfrey | |
| 6,105,153 A | | 8/2000 | Yamada | |
| 6,239,603 B1 | * | 5/2001 | Ukei et al. | 324/763 |
| 6,327,686 B1 | | 12/2001 | Grundmann et al. | |
| 6,329,642 B1 | | 12/2001 | Kaneko et al. | |
| 6,356,490 B1 | | 3/2002 | Matsuo et al. | |
| 6,415,402 B2 | | 7/2002 | Bishop et al. | |
| 6,515,549 B2 | | 2/2003 | Nakano | |
| 6,657,504 B1 | * | 12/2003 | Deal et al. | 331/57 |
| 6,759,863 B2 | * | 7/2004 | Moore | 324/765 |
| 6,958,659 B2 | * | 10/2005 | Nakajima | 331/57 |
| 2002/0035721 A1 | | 3/2002 | Sowboda | |

FOREIGN PATENT DOCUMENTS

WO    02/054094 A1    7/2002

* cited by examiner

*Primary Examiner*—Ha Tran Nguyen  
*Assistant Examiner*—Arleen M. Vazquez

(57) ABSTRACT

Testing devices at various locations on a die may be used to determine one or more properties of the locations. For example, a testing device including an oscillator such as a ring oscillator at a location may be used to determine a silicon quality, temperature, and/or voltage at the location.

26 Claims, 7 Drawing Sheets

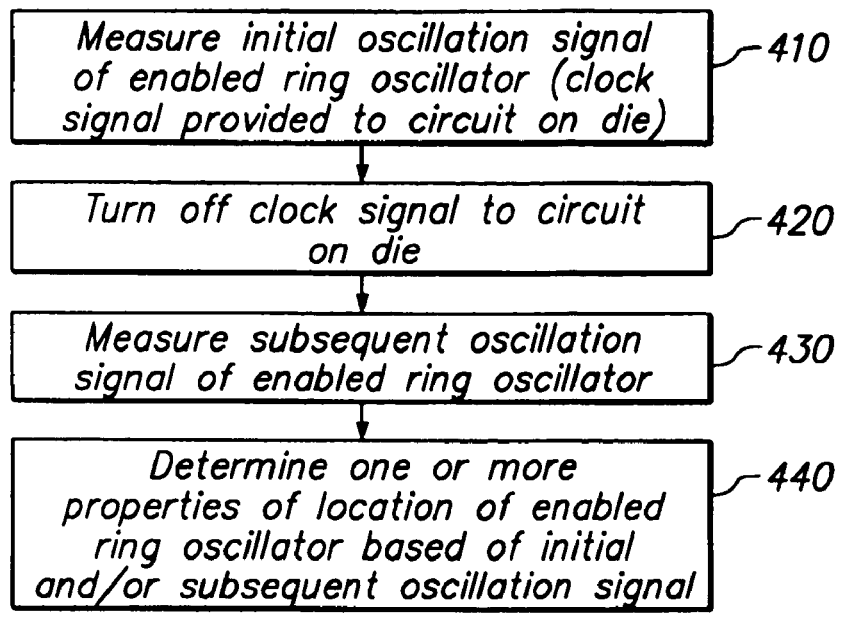
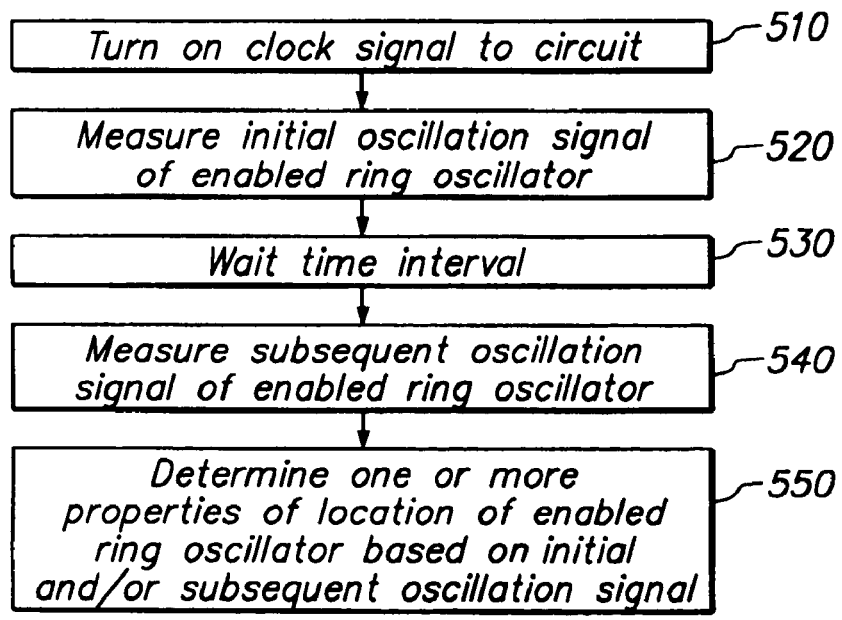

RING OSCILLATOR SYSTEM

CROSS-REFERENCE TO RELATED APPLICATIONS

This application is a divisional application of U.S. patent application Ser. No. 10/444,901, filed May 23, 2003 now U.S. Pat. No. 6,933,739. The disclosure of the prior application is considered part of (and is incorporated by reference in) the disclosure of this application.

TECHNICAL FIELD

This invention relates to integrated circuits.

BACKGROUND

Integrated circuits (e.g., circuits based on silicon technology, gallium arsenide technology, or other technology) may be fabricated by patterning one or more dice on a wafer. After the wafer processing is complete, the dice may be separated and packaged.

Due to process and material variations, the characteristics and performance of circuit elements in different parts of a particular die may differ. For example, a transistor element formed at a first location on a die may have different characteristics and perform differently than an equivalent transistor element located at a different location on the die.

Differences among the circuit elements may affect the overall performance of an integrated circuit on a particular die. A circuit element that performs more poorly than other circuit elements may cause the integrated circuit to perform more poorly than expected. For example, the speed of the integrated circuit may be less than desired, and the integrated circuit may need to be sold at a reduced price. In some cases, the performance of an integrated circuit may be degraded to the extent that it does not meet minimum requirements for sale, and the integrated circuit must be scrapped.

SUMMARY

Testing devices at various locations on a die may be used to determine one or more properties of the locations.

In general, in one aspect, an integrated circuit may include a plurality of circuit elements on a die. The integrated circuit may include a plurality of testing devices separate from the plurality of circuit elements. The testing devices may be positioned at a plurality of locations on the die. The testing devices may be configured to output a signal indicative of one or more characteristics of the associated location. The testing devices may output the signal when at least some of the circuit elements on the die are operating, or when none of the plurality of circuit elements are operating.

The plurality of circuit elements may be elements of, for example a microprocessor or memory circuit. The testing devices may include an oscillator such as a ring oscillator. The signal indicative of one or more characteristics of the associated location may comprise an output of an oscillator. A control element may enable a particular oscillator to produce a signal indicative of characteristics of its location. A multiplexer may output the oscillation signal if the ring oscillator is enabled.

The plurality of testing devices may be configured as a chain of testing devices, although many configurations are possible. For example, the plurality of testing devices may be implemented in a parallel configuration. The integrated circuit may further include a counter to count oscillations of an oscillation signal. Alternately, a counter may be used, but provided separate of the integrated circuit. The one or more characteristics of the location may include a silicon quality, a voltage drop, and/or a temperature.

In general, in one aspect, a semiconductor wafer may include one or more die regions. A first die region may include patterned features corresponding to a plurality of circuit elements and a plurality of testing devices separate from the circuit elements. The patterned features corresponding to the plurality of testing devices may be positioned at a plurality of locations on the first die region. The plurality of testing devices may be configured to output a signal indicative of one or more characteristics of the associated location either when at least some of the circuit elements are operating or when none of the circuit elements are operating.

In general, in one aspect, a method includes forming a plurality of circuit elements on a die. The method may further include forming a plurality of testing devices separate from the plurality of circuit elements, where the plurality of testing devices are positioned at a plurality of locations on the die. Each of the plurality of testing devices may output a signal indicative of one or more characteristics of the associated location, either when at least some of the circuit elements on the die are operating or when none of the circuit elements are operating.

In general, in one aspect, a method includes generating a signal indicative of one or more characteristics of a first location on a die. The method may further include measuring a parameter of the signal and determining a characteristic of the first location based on the measuring. The characteristic of the first location may be, for example, a silicon quality, a temperature, and/or a voltage of the location.

Determining a temperature of the first location may comprise turning off a clock to a circuit on the die, waiting a time interval, and subsequently determining the temperature based on a frequency of an oscillator. Determining the temperature may comprise measuring the frequency at a first time just after a clock to a circuit on the die is turned off, measuring the frequency at a second time after the clock has been on for a thermal equilibrium time, and determining a difference between the frequency at the first time and the frequency at the second time.

Determining a voltage at the first location may comprise measuring the frequency of an oscillator at a first time just after a clock to a circuit on the die has been turned on. Determining the voltage may comprise measuring the frequency of an oscillator at a first time after a clock to a circuit on the die has been turned on for at least a thermal equilibrium time, measuring the frequency at a second time just after the clock to the circuit has been turned off, and determining a difference between the frequency at the first time and the frequency at the second time.

In general, in one aspect, an article comprising a machine-readable medium storing instructions operable to cause one or more machines to perform operations including generating a signal indicative of one or more characteristics of a first location one a die. The operations may further include measuring a parameter of the signal and determining a characteristic of the first location based on the memory.

In general, in one aspect, a system may include means for generating a signal indicative of one or more characteristics of a first location on a die. The system may include means for measuring a parameter of the signal. The system may include means for determining a characteristic of the first location based on the measuring.

The details of one or more implementations are set forth in the accompanying drawings and the description below. Other features and advantages will be apparent from the description and drawings, and from the claims.

DESCRIPTION OF DRAWINGS

FIG. 4 shows another process that may be used to determine a property of a location on a die.

FIG. 5 shows another process that may be used to determine a property of a location on a die.

Like reference symbols in the various drawings indicate like elements.

DETAILED DESCRIPTION

Because poorly performing circuit elements may lead to undesirable consequences such as a reduced device yield and/or reduced profit margin, determining characteristics such as circuit speed, temperature, and voltage drop at different locations on a die are important.

Systems and techniques described herein may be used for non-invasive testing of production dice. Therefore, the systems and techniques may provide more accurate information more quickly and less expensively than existing systems.

Figure 1:
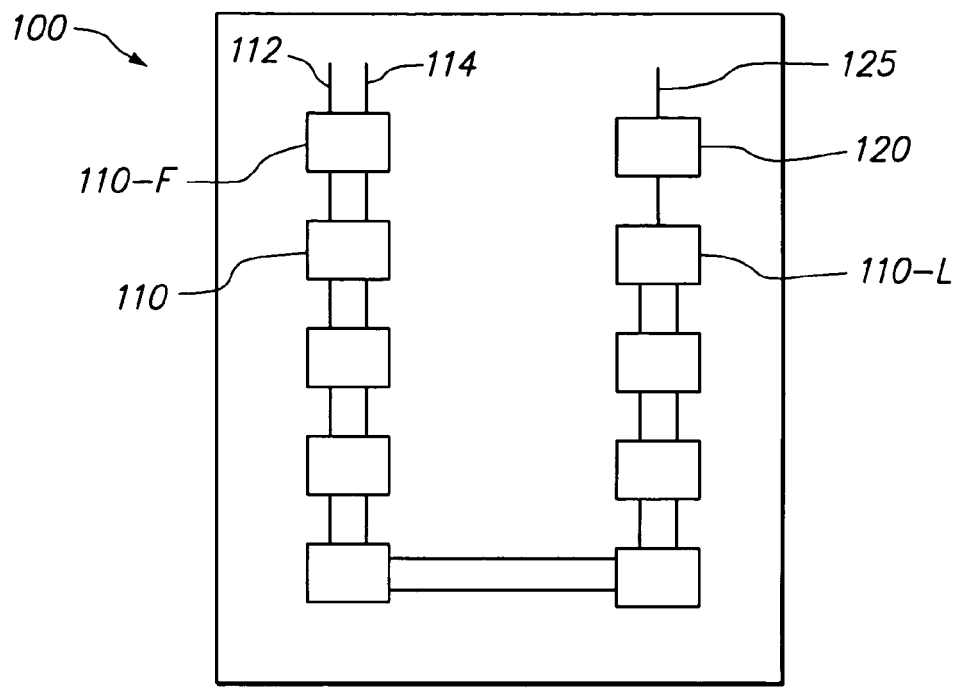
FIG. 1 is a schematic of a die including a plurality of testing devices.

FIG. 1 shows a schematic of a die 100 including a plurality of test structures 110 that may be used to obtain accurate information about properties at different locations on a die. For example, the information may be related to the quality of the silicon (or transistor performance) at or near the location of the test structure 110, the voltage drop at or near the location of the test structure 110, and/or the operating temperature at or near the location of the test structure 110.

The plurality of test structures 110 may be arranged in a chain, with test structure 110-F as the first structure in the chain and 110-L as the last structure in the chain. The output of test structure 110-L may be communicated to a counter 120 with an output 125. Although a chain configuration is shown in FIG. 1, other configurations may be used. For example, test structures 110 may be accessed using a parallel configuration. Further, an external counter rather than an integrated counter may be provided Input signals may be provided to first test structure 110-F using an input 112 and an input 114. The output of each test structure prior to last test structure 110-L may be provided to inputs of the next test structure 110 in the chain.

Figure 2:
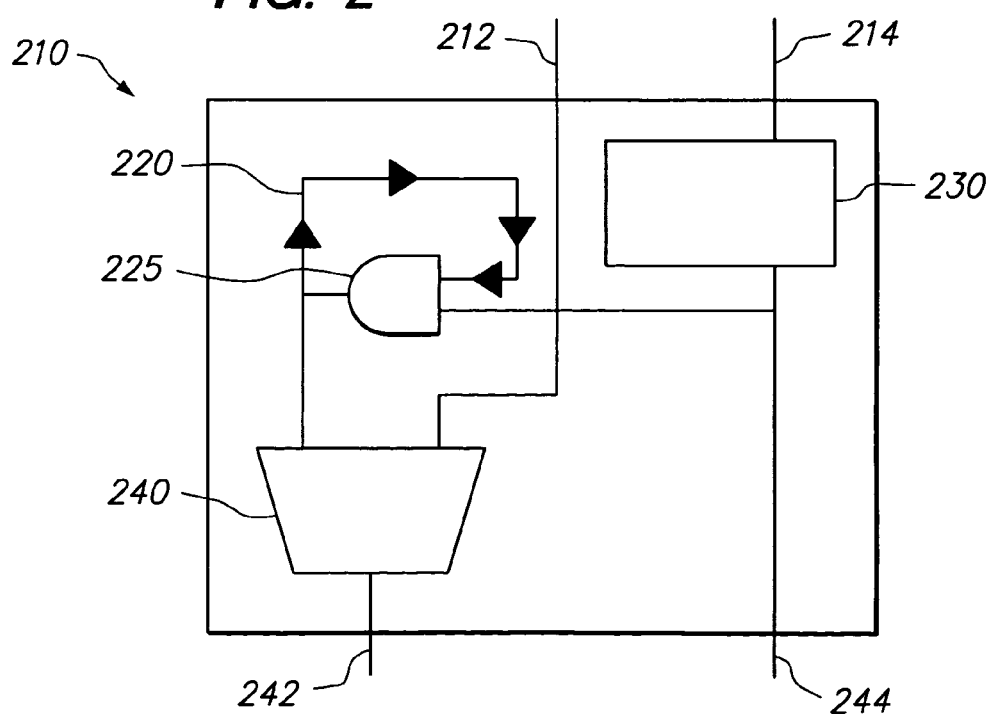
FIG. 2 shows a testing device including a ring oscillator.

FIG. 2 shows an implementation of a test structure 210 that may be used with a die such as die 100 of FIG. 1. Test structure 210 may include an oscillator such as a ring oscillator 220, which may be enabled using a control element such as a flip flop 230. Test structure 210 may include a multiplexer 240. Ring oscillator 220 may comprise an odd number of gates such as an AND gate 225. In an implementation, twenty one gates are used, where at least one gate is an AND gate.

Ring oscillator 220 may be enabled using flip flop 230. When the output of flip flop 230 is a logical one, the output of AND gate 225 may be a logical one, and ring oscillator 220 may be turned on. Ring oscillator 220 is then said to "ring." That is, the output of ring oscillator is a time-varying signal that reflects the speed at which a signal flows from gate to gate in ring oscillator 220.

The output of ring oscillator 220 is provided to a multiplexer 240. If ring oscillator 220 is enabled, output 242 of multiplexer 240 is the oscillation signal of ring oscillator 220. If ring oscillator 220 is not enabled, output 242 of multiplexer 240 is equal to input 212, which may be equal to the oscillation signal of a ring oscillator earlier in a chain of testing devices, or may be a different value if no ring oscillator earlier in the chain is enabled (e.g., may be a logical zero).

Figure 3A:
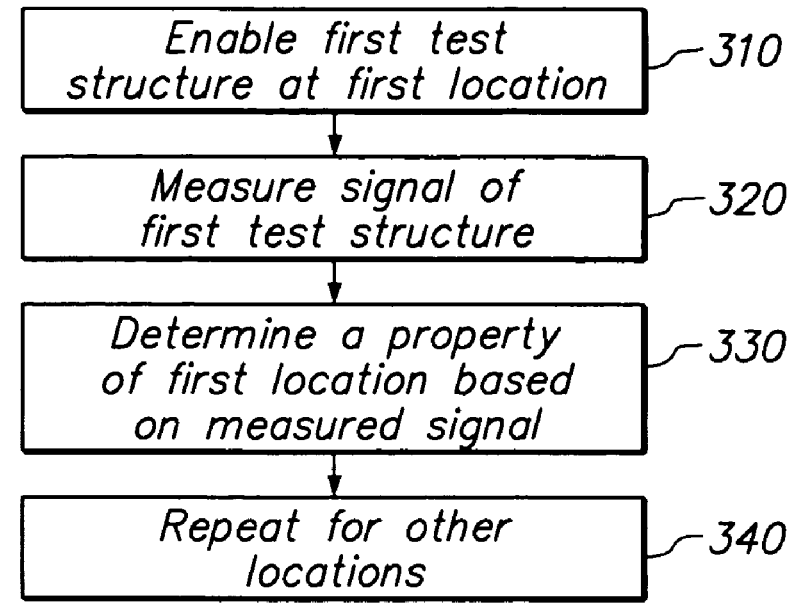
FIG. 3A shows a process that may be used to determine a property of a number of locations on a die.

FIG. 3A shows a process 300 that may be used to determine one or more characteristics at a plurality of locations on a die. A first test structure at a first location on the die may be enabled at 310. The first test structure may be a test structure such as test structure 210 of FIG. 2, or may be implemented differently. The first structure provides a signal indicative of the one or more characteristics proximate to the first location on the die, which may be measured at 320.

A property of the first location may be determined based on the measured signal at 330. For example, the temperature, voltage drop, or silicon quality proximate to the first location may be determined based on the measured signal.

The acts described above may be repeated for other desired locations on the die at 340. In some implementations, a test structure at each location is enabled in turn, and one or more signals indicative of a characteristic is measured. In other implementations, fewer than all of the test structures may be enabled. As stated above, the test structures may be chained, and one test structure in the chain may be enabled at a time. Alternately, at least some of the test structures may be independent of other test structures.

Figure 3B:
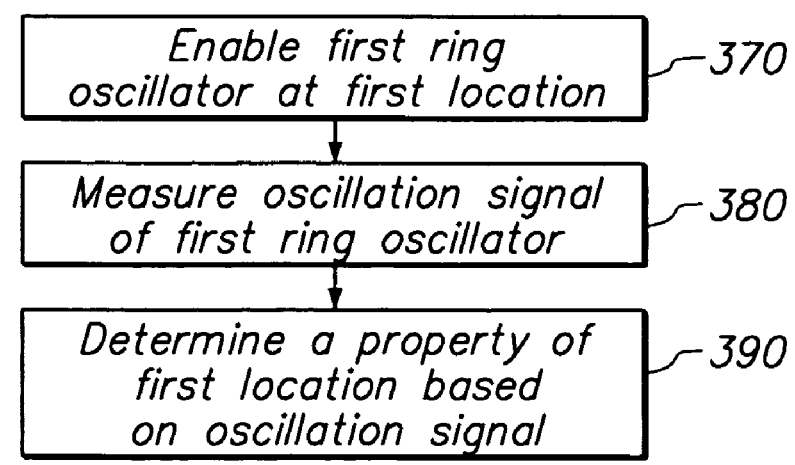
FIG. 3B shows a process that may be used to determine a property of a location on a die.

FIG. 3B shows a process 360 that may be used to test one or more properties of a location on a die, using a test structure implementing a ring oscillator (such as test structure 210 of FIG. 2). A first ring oscillator at a first location is enabled at 370. An oscillation signal of the first ring oscillator may then be measured at 380. For example, a counter may be used to count oscillations of the oscillation signal for a particular time interval. One or more properties of the first location may then be determined based on the oscillation signal at 390. For example, the output of a counter for a particular time interval may be used to measure a circuit speed (which is a measure of the silicon quality). Additional properties that may be determined include a voltage drop and a temperature.

Process 300 may be performed while a clock signal is being provided to an integrated circuit on the die, or while no clock signal is being provided. In some cases, it may provide a benefit to measure an oscillation signal either just after turning on a clock signal to a circuit and/or after turning off a clock signal to a circuit.

For example, a voltage drop or temperature at a first location may be inferred from an oscillation signal of a ring oscillator at the first location. Generally, higher voltages correspond to higher oscillation frequencies, while higher temperatures correspond to lower oscillation frequencies.

If the oscillation signal is measured while a clock signal is being provided to the circuit, the value of the signal may depend both on the temperature and the voltage drop. Since it may be difficult to separate the effects of temperature and voltage drop based on a single measurement of the oscillation signal, two or more measurements may be made.

FIG. 4 shows a process 400 that may be used to separate the effects of the voltage drop and temperature on an oscillation signal. An initial oscillation signal may optionally be measured at 410, while a clock signal is being provide to a circuit on the die. As explained above, the initial oscillation signal may reflect both the voltage drop and temperature of the location on the die.

The clock signal to the circuit on the die may be turned off at 420. A subsequent oscillation signal is measured after the clock signal is turned off at 430. Once the clock signal is turned off, the voltage drop goes to zero (i.e., the voltage increases to the external voltage) in a short time, which may be designated as $\tau_V$. However, the temperature at the location generally changes much more slowly than the voltage drop. For example, the temperature of the location may take a characteristic time $\tau_T$ to reach a new equilibrium temperature after the clock signal has been turned off, where $\tau_T \gg \tau_V$.

Since $\tau_V$ is generally much less than $\tau_T$, the subsequent oscillation signal reflects the effect of the temperature at the location but not the voltage drop of the location. Therefore, the subsequent oscillation signal may be used to infer the temperature of the location. Note that measuring the subsequent oscillation signal just after the clock signal is turned off may provide the most accurate determination of temperature.

If an initial oscillation signal was measured at 410, the initial oscillation signal and subsequent oscillation signal may be used to determine both the voltage drop and temperature of the location. For example, the voltage drop may be inferred from a difference between the initial oscillation signal and the subsequent oscillation signal. Other methods may be used; for example, initial and/or subsequent oscillation data may be compared to calibration data.

FIG. 5 shows a different process 500 for determining a voltage drop and/or a temperature at a location on the die. A clock signal to a circuit on the die may be turned on at 510. An initial oscillation signal of an enabled ring oscillator may be measured at 520. A time interval may elapse at 530. A subsequent oscillation signal of the enabled ring oscillator may optionally be measured at 540. One or more properties of the location of the enabled ring oscillator may be determined based on the initial oscillation signal and/or the subsequent oscillation signal at 550.

Process 500 may be used to separate the effects of voltage drop and temperature on the oscillation signal as follows. Right after the clock signal to the circuit is turned on, the oscillation signal may be affected by the voltage drop. However, since the temperature at the location generally changes more slowly, the initial oscillation signal reflects the voltage drop rather than the temperature at the location.

If the subsequent oscillation signal is measured, the effect of the temperature may be inferred from the initial oscillation signal and the subsequent oscillation signal. For example, the temperature may be inferred from a difference between the initial oscillation signal and the subsequent oscillation signal. Other methods may be used; for example, oscillation data may be compared to calibration data.

Figure 6A:
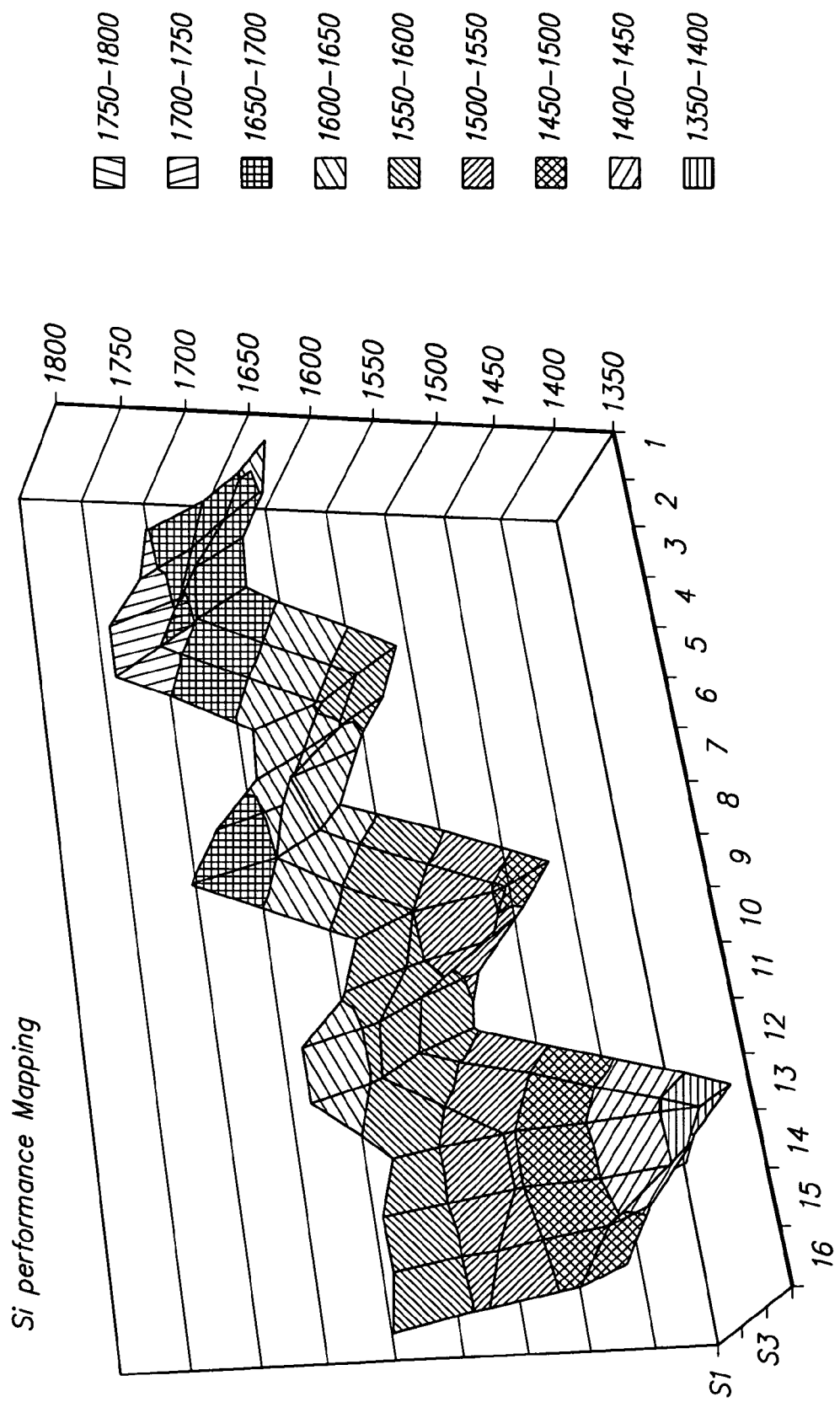
FIGS. 6A-6C show results from an embodiment including a chain of twenty-one testing devices on a die.
Figure 6B:
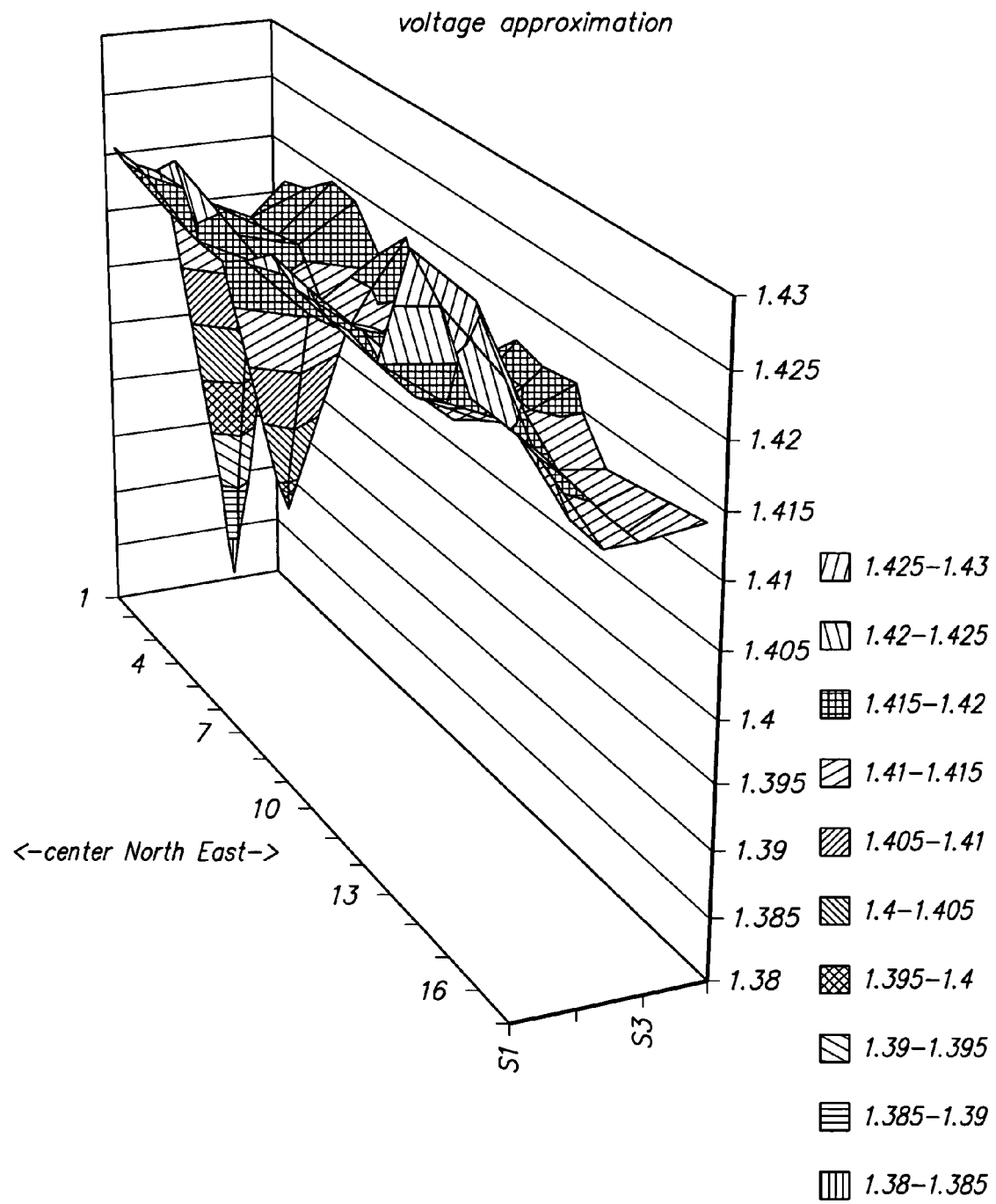
Figure 6C:
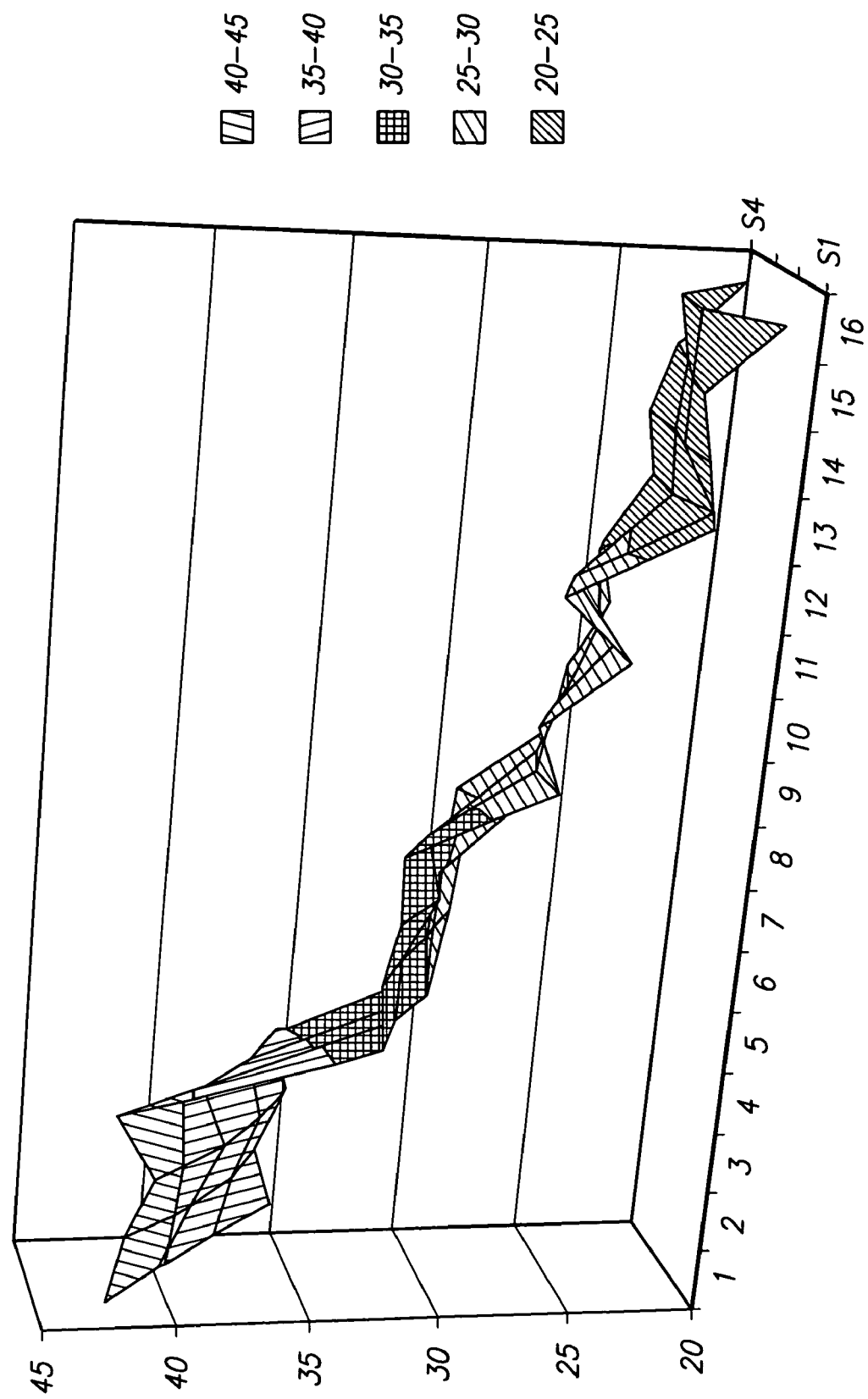

FIGS. 6A-6C show results from a chain of twenty one testing devices on a die (the results for only half of the die are shown in each of FIGS. 6A-6C). In FIG. 6A, the silicon performance varies substantially across the portion of the die shown, due to lens aberration in the lithography system used to form devices on the wafer. FIG. 6B shows the average voltage drop across the portion of the die, with an external voltage of 1.5 V. FIG. 6C shows the temperature across the portion of the die, where only localized activity takes place for about 0.8 seconds on a portion of the die not mapped.

Figure 7:
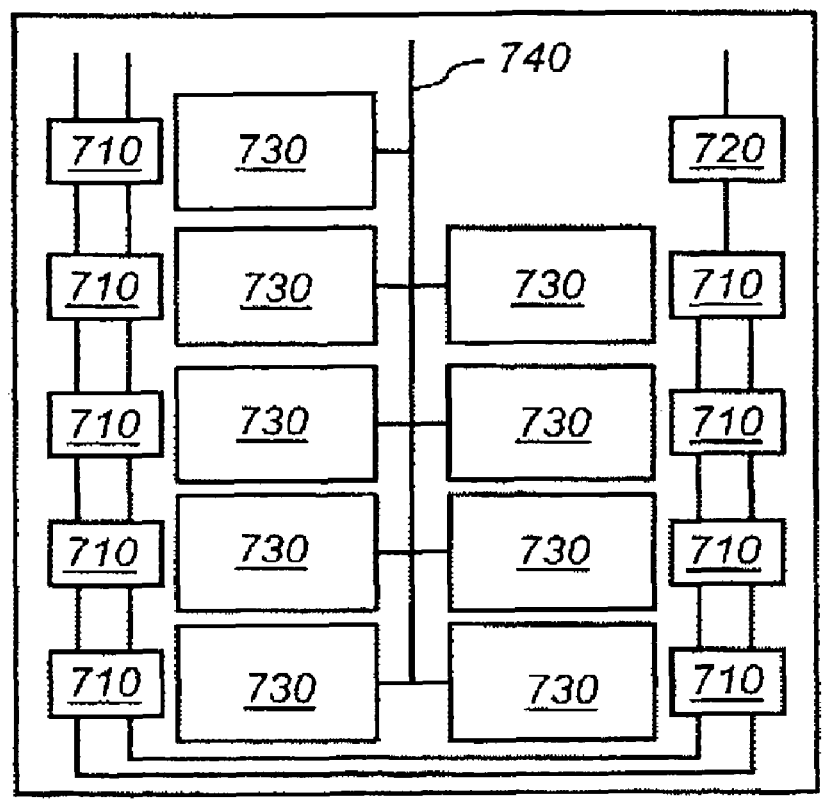
FIG. 7 shows an example die including a plurality of circuit elements and a plurality of testing devices.

FIG. 7 shows an example die 700 including a plurality of circuit elements 730 and a plurality of testing devices 710. The plurality of testing devices 710 are positioned at a plurality of locations on the (die 700, each of the plurality of testing devices 710 to output a signal indicative of one or more characteristics of the associated location. For example, the plurality of testing devices 710 can be test structures, such as described above in connection with FIGS. 1 and 2, and the die 700 can also include a counter 720, such as the counter 120 described in connection with FIG. 1. Each of the plurality of testing devices 710 is further configured to output the signal indicative of one or more characteristics of the associated location when at least some of the plurality of circuit elements 730 on the die 700 are operating (e.g., when a clock signal is provided on a line 740) or when none of the plurality of circuit elements 730 on the die 700 are operating (e.g., when the clock signal is not provided on the line 740). As will be appreciated, the plurality of circuit elements 730 can include various elements of an integrated circuit, which can include elements of a microprocessor in some implementations. Moreover, the systems and techniques described herein can be implemented before the integrated circuit dice are cut from a wafer.

Figure 8:
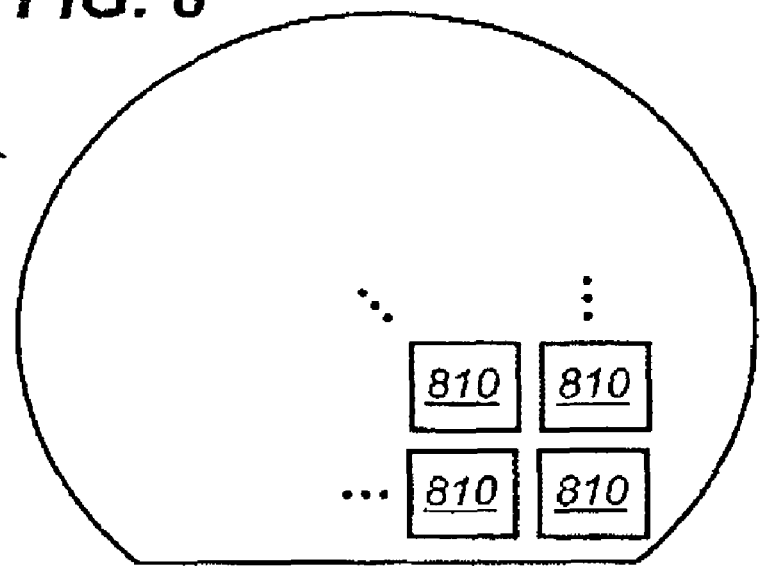
FIG. 8 shows an example semiconductor wafer including die regions.

FIG. 8 shows an example semiconductor wafer 800 including die regions 810. At least one of the die regions 810 includes patterned features corresponding to a plurality of circuit elements and a plurality of testing devices, such as described above in connection with FIG. 7. Thus, the die regions 810 can include various types of integrated circuits, including microprocessors.

A number of implementations have been described. Nevertheless, it will be understood that various modifications may be made without departing from the spirit and scope of the invention. For example, different test structures may be used. For ring oscillator test structures, different numbers and types of gates may be used for the ring oscillators. Different methods and structures may be used to enable the ring oscillators (or other test structures) and to provide an output based on the oscillation signal of an enabled ring oscillator. The test structures may be configured differently than the chain configuration shown in FIG. 1. For example, at least some of the test structures may be accessed in parallel.

Further, The logic flows depicted in FIGS. 3A, 3B, 4, and 5 may not require the particular order shown, or sequential order, to achieve desirable results. For example, in FIG. 3A, determining a property of the first location based on the measured signal may be performed at any point after the signal is measured (e.g., after a signal for all locations has been measured). Accordingly, other embodiments are within the scope of the following claims.

What is claimed is:

1. An integrated circuit, comprising:
   a plurality of circuit elements on a die;
   a plurality of testing devices separate from the plurality of circuit elements, the plurality of testing devices positioned at a plurality of locations on the die, each of the plurality of testing devices to output a signal indicative of one or more characteristics of the associated location, and wherein each of the plurality of testing devices is further configured to output the signal indicative of one or more characteristics of the associated location when at least some of the plurality of circuit elements on the die are operating and when none of the plurality of circuit elements on the die are operating.

2. The integrated circuit of claim 1, wherein the plurality of circuit elements comprise elements of a microprocessor.

3. The integrated circuit of claim 1, wherein each of the plurality of testing devices includes an oscillator.

4. The integrated circuit of claim 3, wherein the signal indicative of one or more characteristics of the associated location comprises an output of the oscillator.

5. The integrated circuit of claim 3, wherein the oscillator is a ring oscillator.

6. The integrated circuit of claim 1, wherein the plurality of testing devices comprises a chain of testing devices.

7. The integrated circuit of claim 6, wherein the chain of testing devices includes a last testing device, and each of the testing devices includes:
    a ring oscillator to produce an oscillation signal having an oscillation frequency when the ring oscillator is enabled; and
    a control element to enable the ring oscillator.

8. The integrated circuit of claim 7, wherein each of the testing devices further includes a multiplexer, the multiplexer to output the oscillation signal if the ring oscillator is enabled, the multiplexer to output an oscillation signal of an earlier ring oscillator in the chain if the earlier ring oscillator is enabled.

9. The integrated circuit of claim 8, further including:
    a counter to receive the output of the multiplexer of the last testing device, the counter to count oscillations of an oscillation signal corresponding to an enabled ring oscillator.

10. The integrated circuit of claim 9, wherein the multiplexer is to output a zero when both the ring oscillator is not enabled and when an earlier ring oscillator in the chain is not enabled.

11. The integrated circuit of claim 7, wherein the ring oscillator comprises a plurality of gates.

12. The integrated circuit of claim 7, wherein the control element comprises a flip flop.

13. The integrated circuit of claim 1, wherein the one or more characteristics include a silicon quality.

14. The integrated circuit of claim 1, wherein the one or more characteristics include a voltage drop.

15. The integrated circuit of claim 1, wherein the one or more characteristics include a temperature.

16. A semiconductor wafer, comprising:
    one or more die regions including a first die region, the first die region including patterned features corresponding to a plurality of circuit elements and a plurality of testing devices separate from the plurality of circuit elements, the patterned features corresponding to the plurality of testing devices positioned at a plurality of locations on the first die region, and wherein each of the plurality of testing devices is configured to output a signal indicative of one or more characteristics of the associated location, and wherein each of the plurality of testing devices is further configured to output a signal indicative of one or more characteristics of the associated location when at least some of the plurality of circuit elements on the first die are operating and when none of the plurality of circuit elements on the first die are operating.

17. The wafer of claim 16, wherein the plurality of circuit elements comprise elements of a microprocessor.

18. The wafer of claim 16, wherein each of the plurality of testing devices includes an oscillator.

19. The wafer of claim 16, wherein the plurality of testing devices is a chain of testing devices including a last testing device, and wherein each of the testing devices includes:
    a ring oscillator to produce an oscillation signal having an oscillation frequency when the ring oscillator is enabled; and
    a control element to enable the ring oscillator.

20. The wafer of claim 19, wherein each of the testing devices further includes a multiplexer, the multiplexer to output the oscillation signal if the ring oscillator is enabled, the multiplexer to output an oscillation signal of an earlier ring oscillator in the chain if the earlier ring oscillator is enabled.

21. The wafer of claim 20, further including:
    a counter to receive the output of the multiplexer of the last testing device, the counter to count oscillations of an oscillation signal corresponding to an enabled ring oscillator.

22. The wafer of claim 16, wherein the one or more characteristics include a silicon quality.

23. The wafer of claim 16, wherein the one or more characteristics include a voltage drop.

24. The wafer of claim 16, wherein the one or more characteristics include a temperature.

25. A method, comprising:
    forming a plurality of circuit elements on a die;
    forming a plurality of testing devices separate from the plurality of circuit elements, the plurality of testing devices positioned at a plurality of locations on the die, each of the plurality of testing devices to output a signal indicative of one or more characteristics of the associated location, and wherein each of the plurality of testing devices is further configured to output the signal indicative of one or more characteristics of the associated location when at least some of the plurality of circuit elements on the die are operating and when none of the circuit elements are operating.

26. The method of claim 25, wherein forming the plurality of testing devices comprises forming a plurality of oscillators.

* * * * *